(12) United States Patent
Liu

(10) Patent No.: US 10,205,298 B2
(45) Date of Patent: Feb. 12, 2019

(54) PACKAGING STRUCTURE FOR FOUR-CHANNEL INTEGRATED TUNABLE LASER ARRAY CHIP

(71) Applicant: Hebei Hymax Optoelecttronics Inc., Hebei (CN)

(72) Inventor: Chao Liu, Beijing (CN)

(73) Assignee: Hebei Hymax Optoelectronics Inc., Zhangjiakou (CN)

(*) Notice: Subject to any disclaimer, the term of this patent is extended or adjusted under 35 U.S.C. 154(b) by 0 days.

(21) Appl. No.: 15/740,673

(22) PCT Filed: Jun. 29, 2015

(86) PCT No.: PCT/CN2015/082680
§ 371 (c)(1),
(2) Date: Dec. 28, 2017

(87) PCT Pub. No.: WO2017/000130
PCT Pub. Date: Jan. 5, 2017

(65) Prior Publication Data
US 2018/0191130 A1 Jul. 5, 2018

(51) Int. Cl.
*H01S 5/022* (2006.01)
*H01S 5/024* (2006.01)
(Continued)

(52) U.S. Cl.
CPC .......... *H01S 5/02276* (2013.01); *H01S 5/022* (2013.01); *H01S 5/026* (2013.01); *H01S 5/02268* (2013.01); *H01S 5/02272* (2013.01); *H01S 5/02288* (2013.01); *H01S 5/02469* (2013.01); *H01S 5/0425* (2013.01); *H01S 5/06821* (2013.01); *H01S 5/125* (2013.01)

(58) Field of Classification Search
CPC . H01S 5/4031; H01S 5/02216; H01S 5/02415
See application file for complete search history.

(56) References Cited

U.S. PATENT DOCUMENTS 6,506,624 B2 * 1/2003 Tatoh ................. H01S 5/02415
257/778
7,148,965 B2 * 12/2006 Nishimura .......... H01S 5/02252
356/416

(Continued)

FOREIGN PATENT DOCUMENTS

CN 1554138 A 12/2004
CN 1719675 A 1/2006

*Primary Examiner* — Michael Carter
(74) *Attorney, Agent, or Firm* — Fox Rothschild LLP

(57) ABSTRACT

A packaging structure for a four-channel integrated tunable laser array chip (100) comprises a carrier (200), a cryogenic refrigerator (300), a lens assembly (400), an isolator assembly (500), a package (600), a transition ring (700), and a thermistor. The packaging structure for the four-channel integrated tunable laser array chip (100) can realize a flexible tuning upon an active coupling of optical paths and ensure a reasonable switching of optical paths between optical assemblies, thereby improving a coupling efficiency for the optical paths and increasing a transmission distance of a digital signal. Furthermore, a design of a radio frequency circuit ensures integrity of a transmitted signal and reduces loss during the transmission.

9 Claims, 7 Drawing Sheets

(51) Int. Cl.
  *H01S 5/026* (2006.01)
  *H01S 5/042* (2006.01)
  *H01S 5/068* (2006.01)
  *H01S 5/125* (2006.01)

(56) References Cited

U.S. PATENT DOCUMENTS

| | | | |
|---|---|---|---|
| 7,317,742 B2 | 1/2008 | Saito et al. | |
| 8,260,150 B2* | 9/2012 | Mahgerefteh | G02B 6/29343 385/24 |
| 2005/0213882 A1* | 9/2005 | Go | G02B 6/4201 385/37 |
| 2006/0006403 A1* | 1/2006 | Matsushima | G02B 6/4201 257/99 |
| 2009/0003398 A1 | 1/2009 | Moto | |
| 2012/0014398 A1 | 1/2012 | Choi | |
| 2013/0038925 A1 | 2/2013 | Nakagawa et al. | |

* cited by examiner

PACKAGING STRUCTURE FOR FOUR-CHANNEL INTEGRATED TUNABLE LASER ARRAY CHIP

TECHNICAL FIELD

The present disclosure relates to the field of optical communication technologies, and more particularly, to a packaging structure for a four-channel integrated tunable laser array chip.

BACKGROUND

In the modern society, demands for optical fiber communication network transmission capacity increase sharply, and there are more and more multiplexing channels of wavelength division multiplexing systems, which needs a great number of lasers having different wavelengths used as light sources of the communication systems. If discrete devices are employed to constitute the communication network, the wavelength division multiplexing systems will be very complicated and bulky, and the maintenance cost will synchronously rise with the transmission capacity. Meanwhile, energy consumption of the communication systems will rise to a surprising degree. To solve the problems of increasingly serious system complexity and energy consumption surge, the best method is to construct the wavelength division multiplexing communication systems by replacing the discrete devices with four-channel integrated chips. Fabricated using monolithic integration technologies, a plurality of devices are integrated into one chip, which may significantly reduce the packaging cost. In addition, integrated optical devices have smaller optical and electrical connection loss and have advantages in optical and electrical properties, stability and reliability.

The integrated semiconductor laser array chip is the most common type of the existing photonic integrated chip. The technology of development of the integrated semiconductor chip is a hot spot at present, and the corresponding packaging technology thereof has drawn more and more attentions. Packaging of this chip is much more complicated than that of the existing conventional discrete cell chip because only careful consideration is take into in terms of optical, thermal, electrical and mechanical structures according to the practical application can good properties of the device be implemented.

SUMMARY

An embodiment of the present disclosure is intended to provide a packaging structure for a four-channel integrated tunable laser array chip.

To achieve the above objective, an embodiment of the present disclosure provides a packaging structure for a four-channel integrated tunable laser array chip (100), including: a carrier (200), a cooler (300), a lens assembly (400), an isolator assembly (500), a housing (600), a transition ring (700), and a thermistor.

The housing (600) includes a pedestal (601), an upper cover plate (607), an optical port (606), a ceramic (602) positioned on an outer lateral wall, and a bonding region (604) positioned on an inner lateral wall. The ceramic (602) is provided with a lead (603). A bonding finger (605) is formed on the bonding region (604). The cooler (300) and the lens assembly (400) are fixed between the pedestal (601) and the upper cover plate (607). The optical port (606) is fixedly connected to the isolator assembly (500) via the transition ring (700).

The carrier (200) is fixed to the cooler (300), is used for carrying the array chip (100) and the thermistor and is provided with a signal transmission line (205). Two ends of the signal transmission line (205) are electrically connected between a chip electrode of the array chip (100) and the bonding finger (605) on the bonding region of the housing.

The lens assembly (400) includes a lens (401) and a lens holder (402) for placing the lens (401). The lens (401) is used for focusing a light beam outputted from the array chip (100) onto a polarizer of the isolator assembly (500).

According to the above technical solutions, the packaging structure for the four-channel integrated tunable laser array chip provided by the embodiment of the present disclosure can implement a flexible tuning upon an active coupling of optical paths and ensure a reasonable switching of optical paths between optical assemblies, thereby improving a coupling efficiency for the optical paths and increasing a transmission distance of a data signal. Furthermore, a design of a radio frequency circuit ensures integrity of signal transmission and reduces transmission loss.

DETAILED DESCRIPTION

Specific embodiments of the present disclosure will be described in detail as below. It is to be noted that embodiments set forth herein are only for illustration, and not restrictive of the present disclosure.

Figure 1:
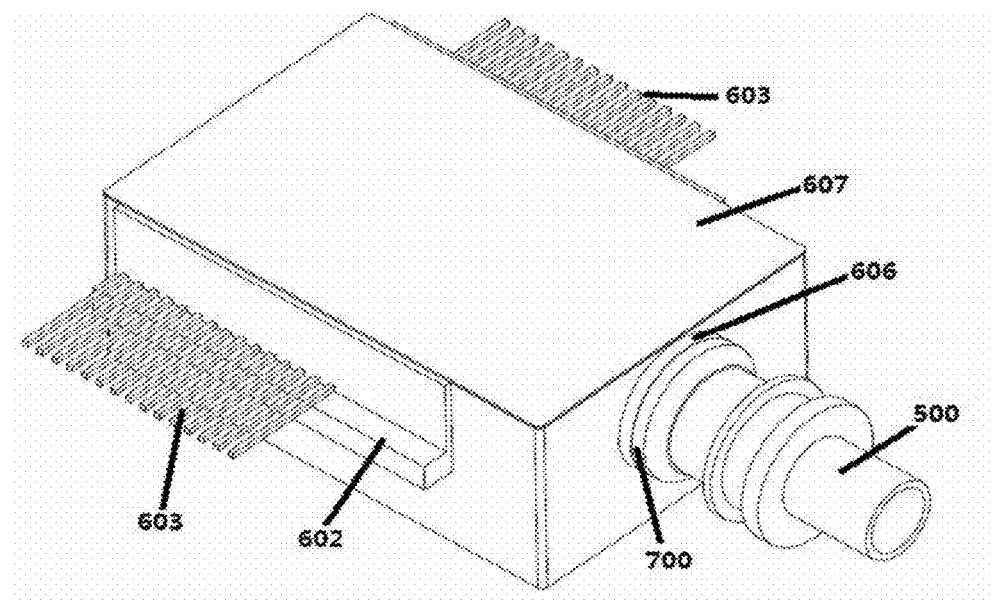
FIG. 1 illustrates a schematic external view of a packaging structure for a four-channel integrated tunable laser array chip according to an embodiment of the present disclosure.
Figure 2:
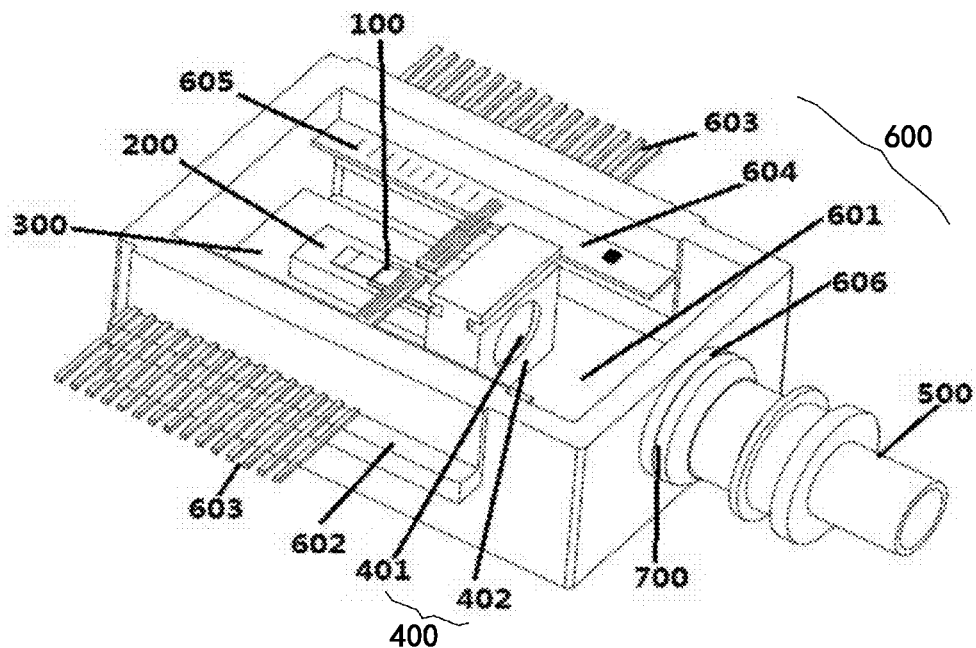
FIG. 2 illustrates a schematic interior view of the packaging structure for a four-channel integrated tunable laser array chip according to an embodiment of the present disclosure.
Figure 3:
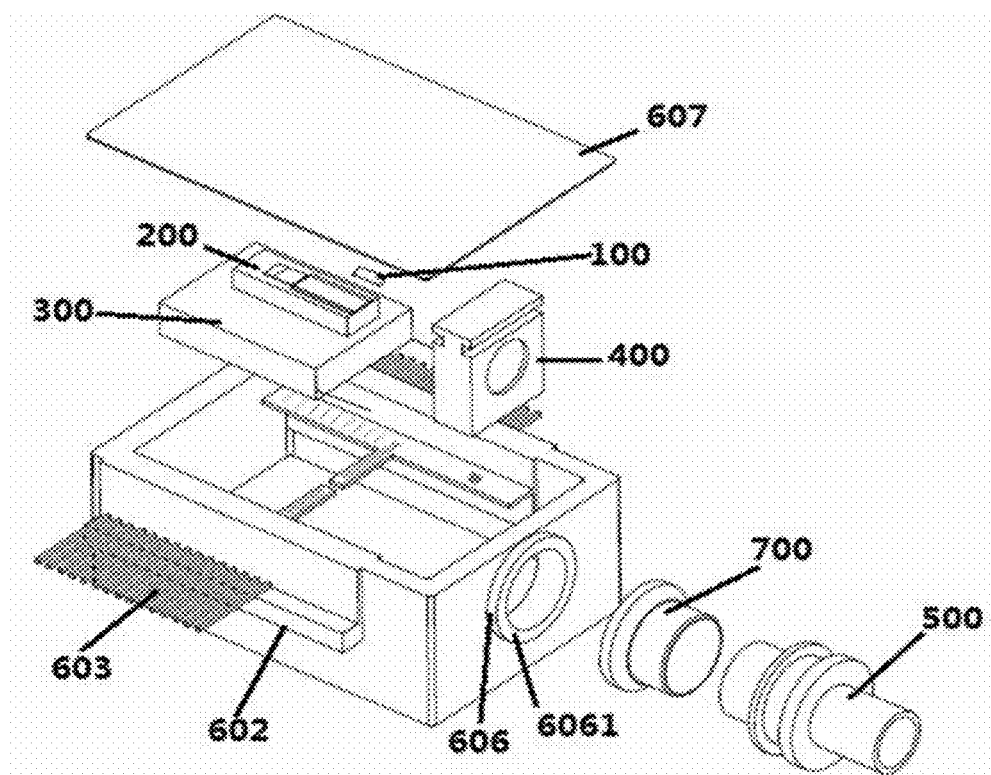
FIG. 3 illustrates a schematic exploded view of the packaging structure for a four-channel integrated tunable laser array chip according to an embodiment of the present disclosure.

FIG. 1-FIG. 3 respectively illustrate a schematic external view, a schematic interior view and a schematic exploded view of a packaging structure for a four-channel integrated tunable laser array chip according to an embodiment of the present disclosure. As shown in FIG. 1-FIG. 3, this embodiment provides a packaging structure for a four-channel integrated tunable laser array chip 100, including: a carrier 200, a cooler 300, a lens assembly 400, an isolator assembly 500, a housing 600, a transition ring 700, and a thermistor (not shown in the figures).

The housing 600 includes a pedestal 601, an upper cover plate 607, an optical port 606, a ceramic 602 positioned on an outer lateral wall, and a bonding region 604 positioned on an inner lateral wall. The ceramic 602 is provided with a lead 603. A bonding finger 605 is formed on the bonding region 604. The cooler 300 and the lens assembly 400 are fixed between the pedestal 601 and the upper cover plate 607. The optical port 606 is fixedly connected to the isolator assembly 500 via the transition ring 700. In an embodiment, both the ceramic 602 and the bonding region 604 of the housing are made from aluminum oxide; and an upper surface of the bonding region 604 is successively plated with tungsten, nickel and gold to form the bonding finger 605. In addition, in an embodiment, the bonding region 604 of the housing is T-shaped, and the bonding finger, on a part of the T-shaped arm penetrating into the housing 600, electrically connected to the signal transmission line 205 is configured as a 50Ω high frequency resistor.

Further as shown in FIG. 2-FIG. 3, the carrier 200 is fixed to the cooler 300, is used for carrying the array chip 100 and the thermistor and is provided with a signal transmission line 205. Two ends of the signal transmission line 205 are electrically connected between a chip electrode of the array chip 100 and the bonding finger 605 on the bonding region of the housing.

Figure 9:
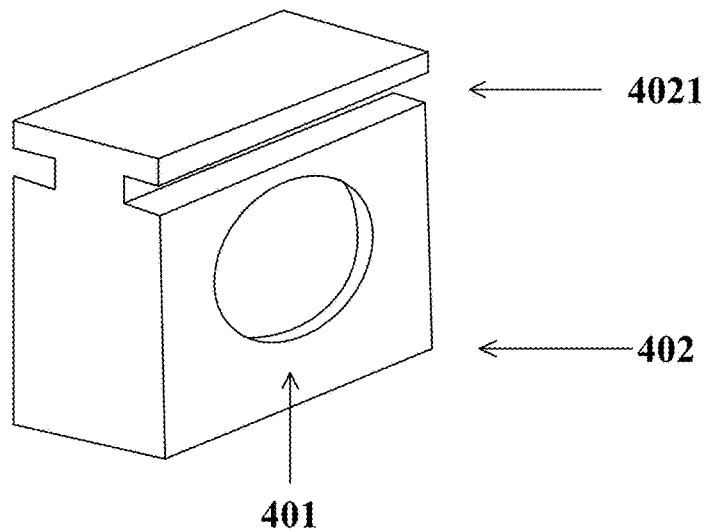
FIG. 9 illustrates a schematic perspective view of a lens assembly according to an embodiment of the present disclosure.

With reference to FIG. 9, the lens assembly 400 includes a lens 401 and a lens holder 402 for placing the lens 401. The lens 401 is used for focusing a light beam outputted from the array chip 100 onto a polarizer of the isolator assembly 500.

Figure 6:
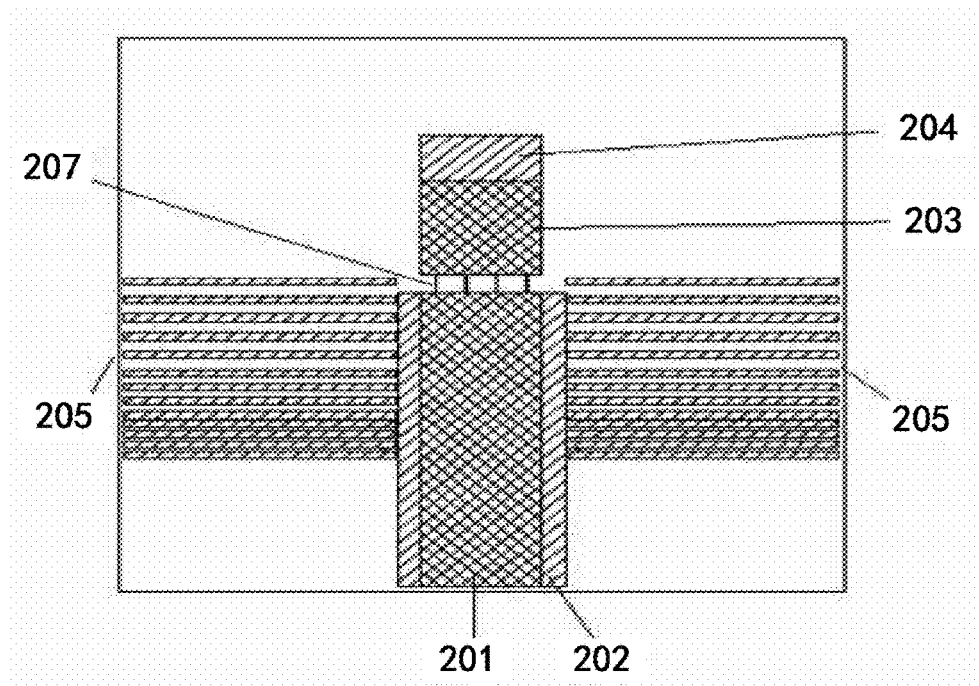
FIG. 6 illustrates a schematic top view of a carrier according to an embodiment of the present disclosure.
Figure 7:
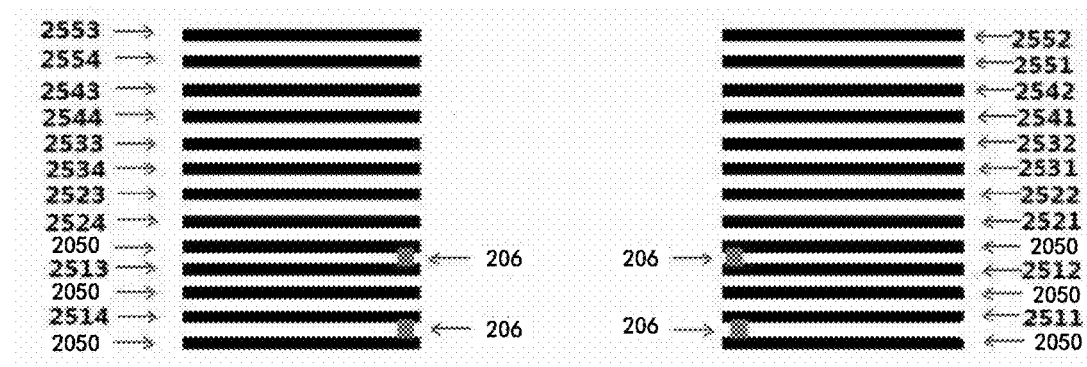
FIG. 7 illustrates a schematic detailed view of a signal transmission line on the carrier according to an embodiment of the present disclosure.

In an embodiment, with reference to FIG. 6 and FIG. 7, the carrier 200 is provided with a metal coating on an upper surface thereof and respectively includes a chip bonding region 201, a chip wire bonding region 202, a thermistor bonding region 203, a thermistor wire bonding region 204, a matching resistor 206, an alignment marker line 207, a signal transmission line 205, and an earth wire 2050. The chip bonding region 201 and the thermistor bonding region 203 are respectively used for fixing and electrically connecting the array chip 100 and the thermistor.

Figure 4:
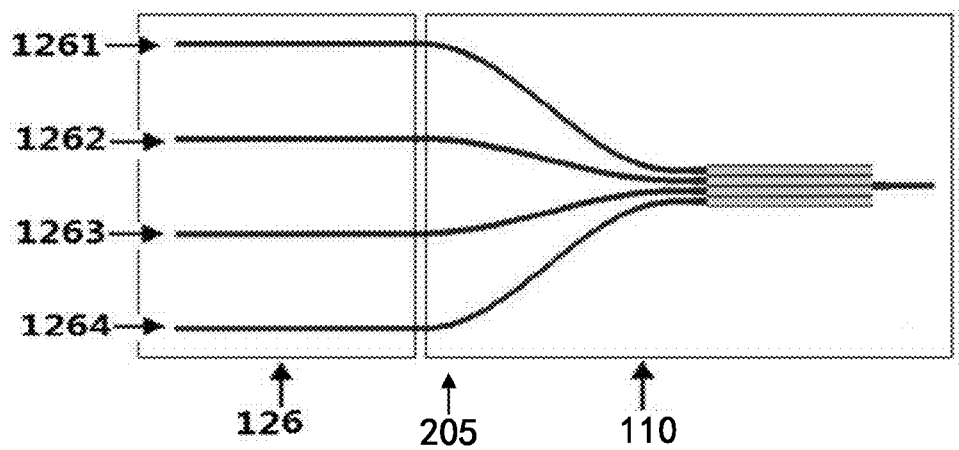
FIG. 4 illustrates a schematic top view of a chipset waveguide according to an embodiment of the present disclosure.
Figure 5:
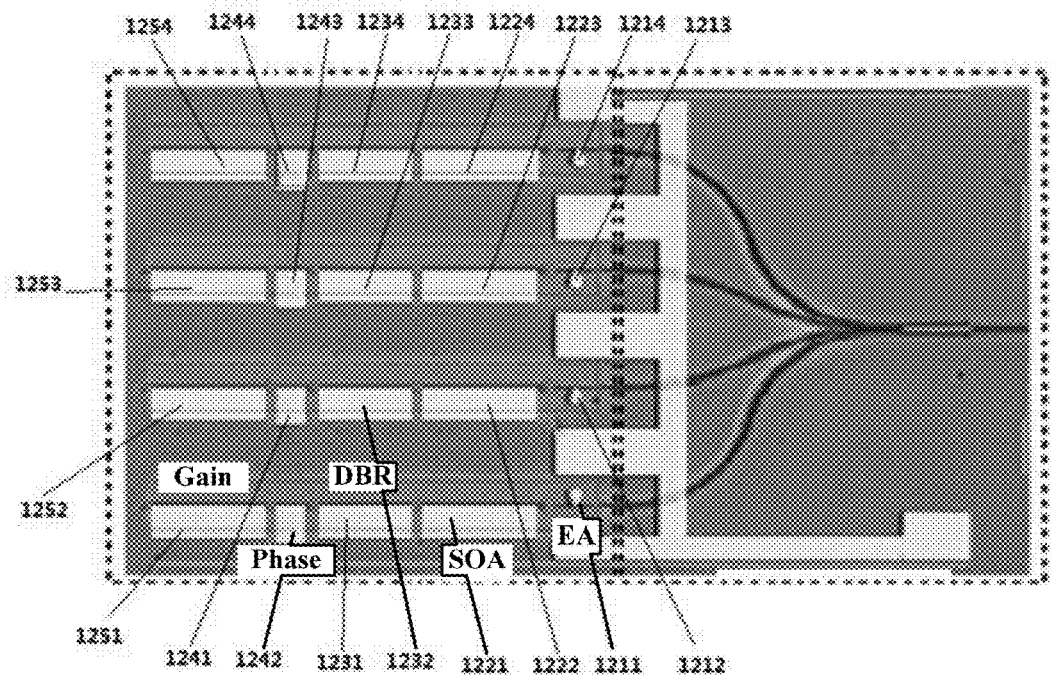
FIG. 5 illustrates a schematic top view of a cell chip according to an embodiment of the present disclosure.

Further with reference to FIG. 4 and FIG. 5, the array chip 100 includes a multiplexing optical waveguide 110, four cell chips 120, and an earth electrode (not shown in the figures) positioned at a back of the array chip. Each of the cell chips 120 includes an electricity absorb (EA) electrode 121, a semiconductor optical amplifier (SOA) electrode 122, a distributed Bragg reflectors (DBR) laser electrode 123, a GAIN tuning electrode 124, a PHASE tuning electrode 125, and an optical waveguide 126. The array chip 100 is eutectically soldered and fixed to the chip bonding region 201 of the carrier. The earth electrode is electrically connected to the chip wire bonding region 202 of the carrier.

The chip wire bonding region 202 is electrically connected to the earth wire 2050 of the carrier. Each electrode of the four cell chips 120 is correspondingly and electrically connected to each signal transmission line 205 of the carrier. The optical waveguides 126 of the four cell chips are respectively consistent with the alignment marker line 207 of the carrier in direction. A light beam outputted from the optical waveguide 126 is subject to multiplexed transmission via the multiplexing optical waveguide 110, and the multiplexing optical waveguide 110 and the optical port 606 of the housing are coaxially arranged.

In an embodiment, the carrier 200 includes two groups of the signal transmission lines 205. Each group of the signal transmission lines 205 include three ground transmission lines, two EA signal transmission lines, two SOA signal transmission lines, two DBR signal transmission lines, two GAIN signal transmission lines, and two PHASE signal transmission lines. Each EA signal transmission line is configured as a 50Ω high frequency resistor. A 50Ω matching resistor 206 is connected between each EA signal transmission line and an adjacent ground transmission line. In an embodiment, the carrier 200 is made from beryllium oxide or aluminum nitride. The metal coating is formed using a sputtering technology and is made from a TiW/Au alloy. Both the chip bonding region 201 and the thermistor bonding region 203 are prefabricated and formed by means of electroplating using an Au/Sn alloy. The matching resistor 206 is formed using the sputtering technology and is made from TaN. In an embodiment, the matching resistor 206 on the carrier 200 is a 50Ω square thin-film resistor.

In an embodiment, the thermistor is soldered onto the thermistor bonding region 203 of the carrier according to a bonding mark on the carrier 200. An upper electrode of the thermistor is electrically connected to the corresponding signal transmission line 205 on the carrier 200 directly, and a lower electrode thereof is electrically connected to the corresponding signal transmission line 205 via a soldering gold wire of the thermistor wire bonding region 204. In an embodiment, the thermistor is a two-side gold-plated square resistor.

Figure 11:
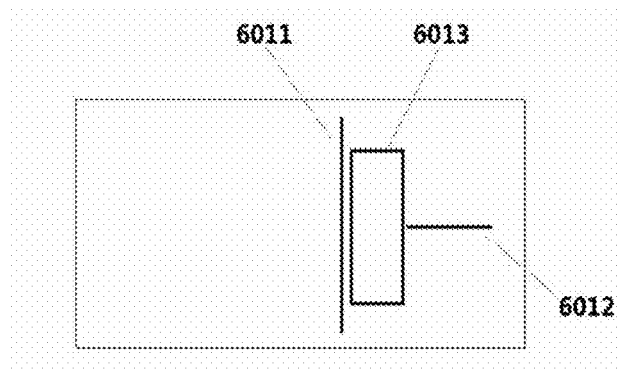
FIG. 11 illustrates a top view of a pedestal of a housing according to an embodiment of the present disclosure.

With reference to FIG. 11, in an embodiment, the upper surface of the pedestal 601 of the housing 600 is carved with: a cooler placement marker line 6011, used for marking flush with an edge of the cooler 300 where a lead side is arranged; a light beam transmission marker line 6012, used for marking consistent with a center axial direction of the cooler 300; and a lens holder placement marker box 6013, used for marking a fixed position of the lens holder 402.

Figure 8:
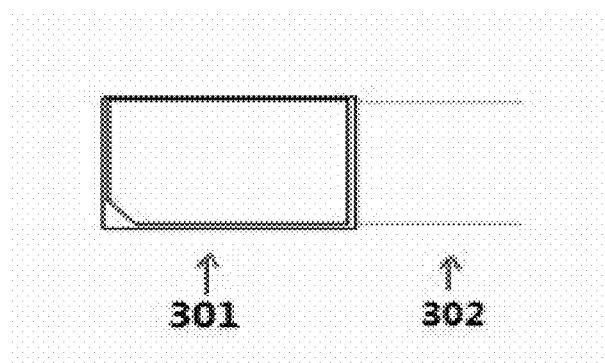
FIG. 8 illustrates a schematic top view of a cooler according to an embodiment of the present disclosure.

With reference to FIG. 8, in an embodiment, the cooler 300 is a thermoelectric cooler, including: an upper substrate and a lower substrate 301, multiple pairs of semiconductor couples positioned between the upper substrate and the lower substrate, and two leads 302. The thermoelectric cooler 300 is fixed to the pedestal 601 of the housing via the lower substrate 301. The two leads 302 face towards the optical port 606 of the housing and are electrically connected to two bonding fingers 605 on the inner lateral wall of the housing respectively. Correspondingly, the bonding fingers 605 electrically connected to the two leads 302 of the thermoelectric cooler are formed into a rectangle, for ease of soldering. In an embodiment, an end surface of an end of an output optical waveguide of the array chip 100, an end surface of an end of a chip attached to the carrier 200 and an end surface of an end of a lead of the cooler 300 are flush with each other. In addition, in an embodiment, the upper substrate and the lower substrate of the thermoelectric cooler 300 are thermal conductive ceramic materials and plated with gold on external surfaces thereof. The thermoelectric cooler 300 is bonded by fulmargin or eutectically soldered onto the pedestal 601 of the housing.

Figure 10:
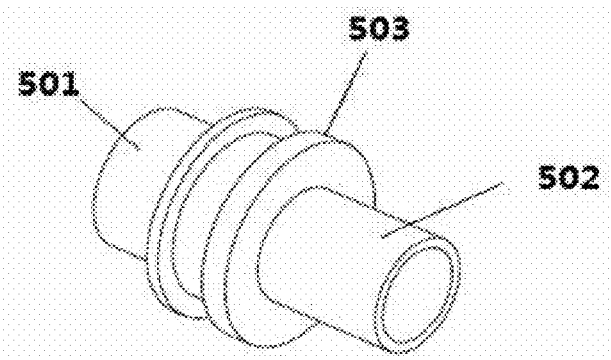
FIG. 10 illustrates a schematic perspective view of an isolator assembly according to an embodiment of the present disclosure.
Figure 13:
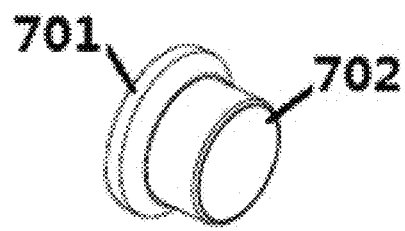
FIG. 13 illustrates a schematic perspective view of a transition ring according to an embodiment of the present disclosure.

With reference to FIG. 10, in an embodiment, the isolator assembly 500 has an optical inlet 501 and an optical outlet 502. With reference to FIG. 13, in an embodiment, the transition ring 700 has a large opening 701 and a small opening 702. The optical inlet 501 of the isolator assembly is fixedly connected to the small opening 702 of the transition ring, and the large opening 701 of the transition ring is fixedly connected to the optical port 606 of the housing.

Further with reference to FIG. 1-FIG. 3 again, in an embodiment, the housing 600 is shaped like a rectangular cavity in top view. Outer sides of housing walls at two sides of a long edge of the rectangle are provided with two rows of the ceramics 602, and 15 leads 603 are brazed on each row of the ceramics 602. Inner sides of the housing walls at the two sides are provided with two groups of the bonding regions 604, and 15 bonding fingers 605 are plated on each group of the bonding regions 604. Electric connection between each of the bonding fingers 605 and each signal transmission line 205 of the carrier is implemented via a gold wire or lead. The bonding finger 605 finally electrically connected to the EA electrodes 121 of the four cell chips 120 via the signal transmission line 205 is configured as a 50Ω high frequency resistor.

Based on the packaging structure described in the above embodiment, now a corresponding packaging method for a four-channel integrated tunable laser array chip is briefly described as below.

First, the lower end surface of the cooler 300 is coated with fulmargin or soldered with tin, next the thermoelectric cooler 300 is bonded or soldered onto the pedestal 601 of the housing. The lead 302 of the thermoelectric cooler faces towards the optical port 606 of the housing, a center axial direction of the thermoelectric cooler 300 is consistent with a light beam transmission marker line 602. An edge of the lead side of the thermoelectric cooler 300 is flush with the cooler placement marker line 6011 on the pedestal 601 of the housing.

Further with reference to FIG. 3 and FIG. 11, a chipset 100 is placed on the chip bonding region 201 of the carrier, and a position of the chipset 100 is adjusted so that the optical waveguides 126 of the four cell chips are consistent with the four alignment marker lines 207 of the carrier in direction, and the chipset 100 is eutectically soldered and fixed to the carrier 200.

Further with reference to FIG. 3-FIG. 5 and FIG. 7, first, the chip wire bonding region 202 soldered together with the earth electrodes of the four cell chips is connected to the earth wire on the carrier 200 with a gold wire. Next, each electrode on the chip is connected to the corresponding transmission line on the carrier by way of soldering with the gold wire. With reference to FIG. 5 and FIG. 7, specifically connected electrodes and the corresponding transmission lines are respectively as below: EA electrode 1211 and transmission line 2511, SOA electrode 1212 and transmission line 2512, DBR electrode 1213 and transmission line 2513, GAIN electrode 1214 and transmission line 2514; EA electrode 1221 and transmission line 2521, SOA electrode 1222 and transmission line 2522, DBR electrode 1223 and transmission line 2523, GAIN electrode 1224 and transmission line 2524; EA electrode 1231 and transmission line 2531, SOA electrode 1232 and transmission line 2532, DBR electrode 1233 and transmission line 2533, GAIN electrode 1234 and transmission line 2534; EA electrode 1241 and transmission line 2541, SOA electrode 1242 and transmission line 2542, DBR electrode 1243 and transmission line 2543, GAIN electrode 1244 and transmission line 2544; EA electrode 1251 and transmission line 2551, SOA electrode 1252 and transmission line 2552, DBR electrode 1253 and transmission line 2553, and GAIN electrode 1254 and transmission line 2554. The chip wire bonding region 202 is connected to the earth wire 2050 by bonding six gold wires.

Figure 12:
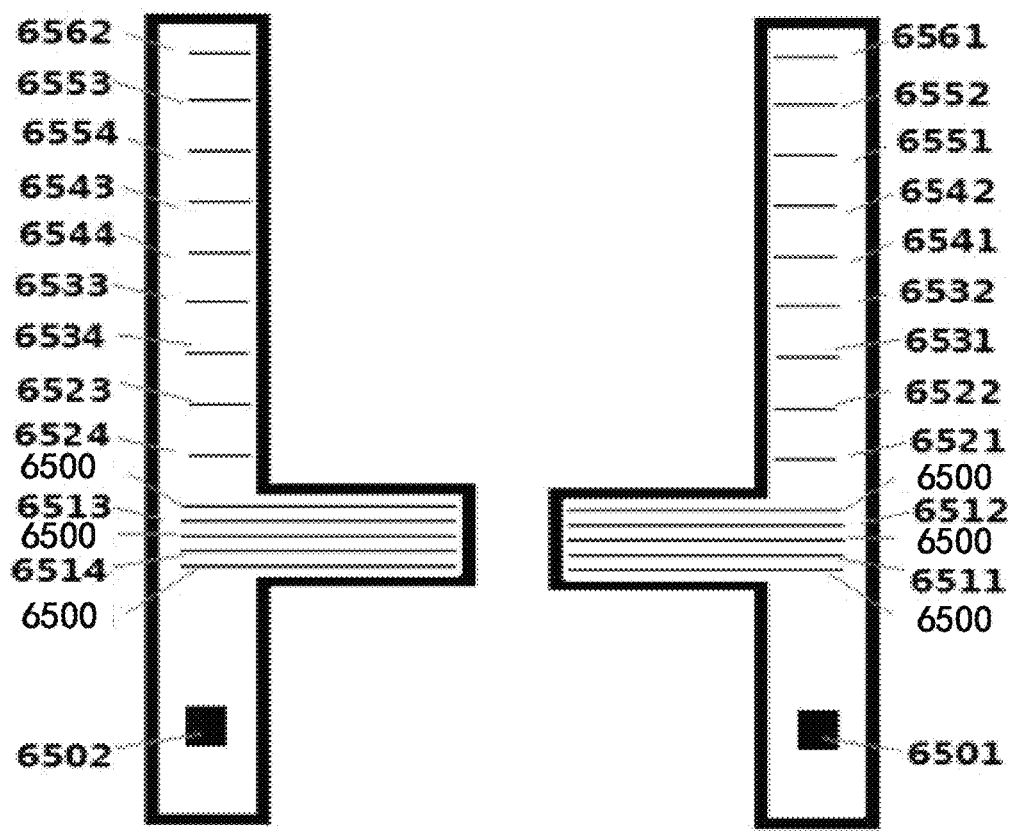
FIG. 12 is a schematic diagram illustrating distribution of bonding fingers on a bonding region according to an embodiment of the present disclosure.

Further with reference to FIG. 7 and FIG. 12, the transmission lines of the carrier are connected to the corresponding bonding fingers 605 on the housing 600 by way of soldering with the gold wires. Specifically connected transmission lines and the corresponding bonding fingers are respectively as below: 2511 and 6511, 2512 and 6512, 2513 and 6513, 2514 and 6514; 2521 and 6521, 2522 and 6522, 2523 and 6523, 2524 and 6524; 2531 and 6531, 2532 and 6532, 2533 and 6533, 2534 and 6534; 2541 and 6541, 2542 and 6542, 2543 and 6543, 2544 and 6544; 2551 and 6551, 2552 and 6552, 2553 and 6553, 2554 and 6554, and 2050 and 6500.

Figure 14:
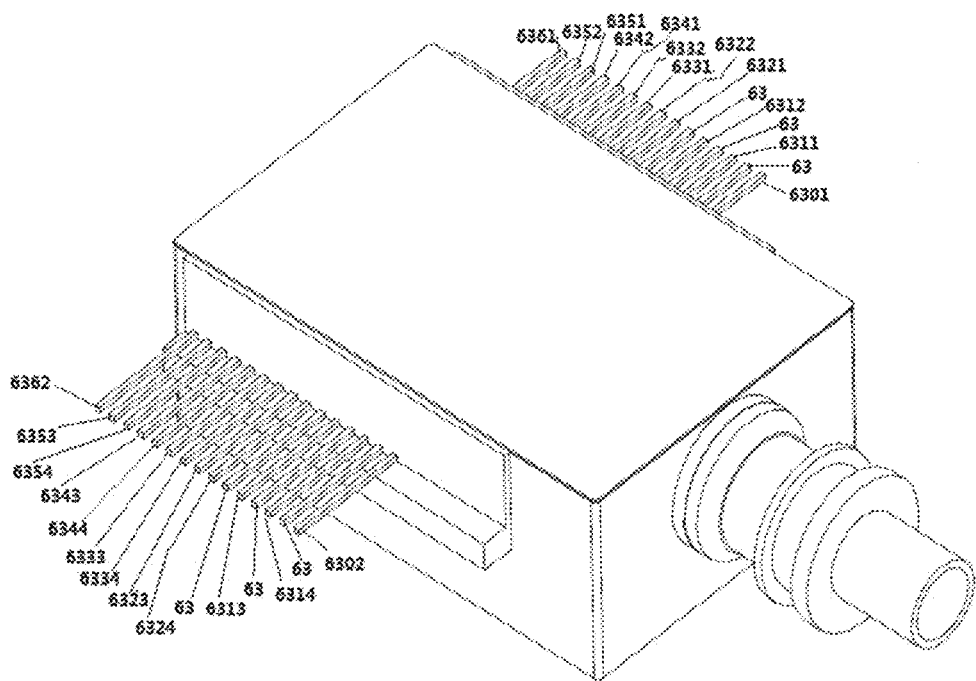
FIG. 14 illustrates a schematic diagram of a lead of the housing according to an embodiment of the present disclosure.

Further, the lens is positioned. As shown in FIG. 9, the lens 401 is bonded onto a lens holder 402 using glue, and then a groove 4021 of the lens holder 402 is fixed to a coupling clamp. By adjusting the clamp, a bottom surface of the lens holder 402 is placed in a lens holder placement marker box 6013 on an upper surface of the pedestal 601 of the housing 600. Next, an end of a coupling fiber is connected to an optical power meter, and the other end thereof passes through the optical port 606 of the housing from an external side to detect an optical signal. Further referring to FIG. 14 after the above two steps are prepared. An SOA signal lead and a GAIN signal lead of a cell chip are simultaneously energized, and specifically two leads of the following four groups of leads are energized: 6321 and 6341, 6322 and 6342, 6323 and 6343, and 6324 and 6344. After the leads are energized, laser may be outputted from 11 ends of 4×1 optical waveguide of the chipset 100. Positions of the lens holder 402 and the coupling fiber are adjusted so that optical power detected by the optical power meter is the maximum. The position of the lens holder 402 is bonded and fixed using glue when the optical power is the maximum.

Finally, the isolator is positioned. With reference to FIG. 3, FIG. 10 and FIG. 13, a stub of the coupling fiber is first closely inserted into an LC optical interface of the small opening 502 of the isolator assembly 500, and the other end of the coupling fiber is connected to the optical power meter. Next, the transition ring 700 is sleeved on an outer side of the optical inlet 501 of the isolator assembly 500, and the direction of the small opening 702 of the transition ring 700 faces towards that of the optical outlet 502 of the isolator assembly 500. Next, the housing 600, the isolator assembly 500 and the transition ring 700 are installed on the coupling clamp, so that an outer edge of the optical port 606 on the housing 600 comes into close contact with that of the large opening 701 of the transition ring 700. The position of the isolator assembly 500 is adjusted until the optical power meter reaches a maximum reading. Relative positions of the housing 600, the transition ring 700 and the isolator assembly 500 at this moment are fixed. The edge of the large opening 701 of the transition ring 700 and the optical port 606 of the housing 600 are soldered and fixed by way of laser soldering, and later the lateral wall of the small opening 702 of the transition ring 700 and an outer wall of the optical inlet 501 of the isolator assembly 500 are soldered and fixed in the same way.

As can be seen from the above technical solutions, the packaging structure for the four-channel integrated tunable laser array chip provided by the embodiment of the present disclosure can implement a flexible tuning upon an active coupling of optical paths and ensure a reasonable switching of optical paths between optical assemblies, thereby improving a coupling efficiency for the optical paths and increasing a transmission distance of a data signal. Furthermore, a design of a radio frequency circuit ensures integrity of signal transmission and reduces transmission loss.

Although description of the present disclosure is made in reference to a plurality of typical embodiments, it shall be understood that terms used herein are exemplary and explanatory only and are not restrictive. The present disclosure can be concretely implemented in various forms without departing from spirit or substance of the present disclosure. Therefore, it shall be understood that above embodiments are not limited to any foregoing detail, but shall be extensively interpreted within the spirit and scope as defined in appended claims. Thus, all variations and modifications falling within claims or equivalent scope thereof shall be covered with appended claims.

What is claimed is:

1. A packaging structure for a four-channel integrated tunable laser array chip (100), comprising: a carrier (200), a cooler (300), a lens assembly (400), an isolator assembly (500), a housing (600), a transition ring (700), and a thermistor, wherein
   the housing (600) comprises a pedestal (601), an upper cover plate (607), an optical port (606), a ceramic (602) positioned on an outer lateral wall, and a bonding region (604) positioned on an inner lateral wall; the ceramic (602) is provided with a lead (603); a bonding finger (605) is formed on the bonding region (604); the cooler (300) and the lens assembly (400) are fixed between the pedestal (601) and the upper cover plate (607); the optical port (606) is fixedly connected to the isolator assembly (500) via the transition ring (700);
   the carrier (200) is fixed to the cooler (300), is used for carrying the array chip (100) and the thermistor and is provided with a signal transmission line (205), and two ends of the signal transmission line (205) are electrically connected between a chip electrode of the array chip (100) and the bonding finger (605) on the bonding region of the housing; and
   the lens assembly (400) comprises a lens (401) and a lens holder (402) for placing the lens (401), and the lens (401) is used for focusing a light beam outputted from the array chip (100) onto a polarizer of the isolator assembly (500),
   wherein an end surface of an end of an output optical waveguide of the array chip (100), an end surface of an end of a chip attached to the carrier (200) and an end surface of an end of a lead of the cooler (300) are flush with each other.

2. The packaging structure according to claim 1, wherein the carrier (200) is provided with a metal coating on an upper surface thereof and respectively comprises a chip bonding region (201), a chip wire bonding region (202), a thermistor bonding region (203), a thermistor wire bonding region (204), a matching resistor (206), an alignment marker line (207), and a signal transmission line (205); and the chip bonding region (201) and the thermistor bonding region (203) are respectively used for fixing and electrically connecting the array chip (100) and the thermistor.

3. The packaging structure according to claim 2, wherein the array chip (100) comprises a multiplexing optical waveguide (110), four cell chips (120), and an earth electrode positioned at a back of the array chip; each of the cell chips (120) comprises an electricity absorb (EA) electrode (121), a semiconductor optical amplifier (SOA) electrode (122), a distributed Bragg reflectors (DBR) laser electrode (123), a GAIN tuning electrode (124), a PHASE tuning electrode (125), and an optical waveguide (126);
   the array chip (100) is eutectically soldered and fixed to the chip bonding region (201) of the carrier, the earth electrode is electrically connected to the chip wire bonding region (202) of the carrier, the chip wire bonding region (202) is electrically connected to an earth wire of the carrier, and each electrode of the four cell chips (120) is correspondingly electrically connected to each signal transmission line (205) of the carrier; and
   the optical waveguides (126) of the four cell chips are respectively consistent with the alignment marker line (207) of the carrier in direction, a light beam outputted from the optical waveguide (126) is subject to multiplexed transmission via the multiplexing optical waveguide (110), and the multiplexing optical waveguide (110) and the optical port (606) of the housing are coaxially arranged.

4. The packaging structure according to claim 3, wherein the carrier (200) comprises two groups of the signal transmission lines (205), each group of the signal transmission lines (205) comprising three ground transmission lines, two EA signal transmission lines, two SOA signal transmission lines, two DBR signal transmission lines, two GAIN signal transmission lines, and two PHASE signal transmission lines.

5. The packaging structure according to claim 2, wherein the thermistor is soldered onto the thermistor bonding region (203) of the carrier according to a bonding mark on the carrier (200), an upper electrode of the thermistor is electrically connected to the corresponding signal transmission line (205) on the carrier (200) directly, and a lower electrode thereof is electrically connected to the corresponding signal transmission line (205) via a soldering gold wire of the thermistor wire bonding region (204).

6. The packaging structure according to claim 1, wherein the cooler (300) is a thermoelectric cooler, comprising an upper substrate and a lower substrate (301), multiple pairs of semiconductor couples positioned between the upper substrate and the lower substrate, and two leads (302); the thermoelectric cooler (300) is fixed to the pedestal (601) of the housing via the lower substrate (301), and the two leads (302) face towards the optical port (606) of the housing and are electrically connected to two bonding fingers (605) on the inner lateral wall of the housing respectively.

7. The packaging structure according to claim 1, wherein the isolator assembly (500) has an optical inlet (501) and an optical outlet (502), the transition ring (700) has a large opening (701) and a small opening (702), the optical inlet (501) of the isolator assembly is fixedly connected to the small opening (702) of the transition ring, and the large opening (701) of the transition ring is fixedly connected to the optical port (606) of the housing.

8. The packaging structure according to claim 1, wherein the housing (600) is shaped like a rectangular cavity in top view, outer sides of housing walls at two sides of a long edge of the rectangle are provided with two rows of the ceramics (602), 15 leads (603) are brazed on each row of the ceramics (602), inner sides of the housing walls at the two sides are provided with two groups of the bonding regions (604), 15 bonding fingers (605) are plated on each group of the bonding regions (604), and electric connection between each of the bonding fingers (605) and each signal transmission line (205) of the carrier is implemented via a gold wire or lead.

9. The packaging structure according to claim 1, wherein the bonding region (604) of the housing is T-shaped, and the bonding finger electrically connected to the signal transmission line (205) is configured as a 50Ω high frequency resistor.

* * * * *